United States Patent [19]

Pamulapati et al.

[11] Patent Number: 5,427,648
[45] Date of Patent: Jun. 27, 1995

[54] METHOD OF FORMING POROUS SILICON

[75] Inventors: Jagadeesh Pamulapati, Eatontown; Hongen Shen, Howell; Mitra Dutta, Matawan, all of N.J.

[73] Assignee: The United States of America as represented by the Secretary of the Army, Washington, D.C.

[21] Appl. No.: 291,790

[22] Filed: Aug. 15, 1994

[51] Int. Cl.⁶ .............................................. H01L 21/00
[52] U.S. Cl. ................................................ 216/24; 216/99
[58] Field of Search ................. 156/644, 662, 651, 654, 156/643; 204/129.1, 129.3, 129.65

[56] References Cited

U.S. PATENT DOCUMENTS

| | | | |
|---|---|---|---|
| 3,619,608 | 11/1971 | Westerberg | 437/20 X |
| 3,962,052 | 6/1976 | Abbas et al. | 204/129.3 |
| 4,109,029 | 8/1978 | Ozdemir et al. | 437/17 |
| 4,348,804 | 9/1982 | Ogawa et al. | 437/17 |
| 5,106,764 | 4/1992 | Harriott et al. | 437/18 |
| 5,139,624 | 8/1992 | Searson et al. | 204/129.3 |
| 5,147,823 | 9/1992 | Ishibashi et al. | 437/225 |
| 5,206,523 | 4/1993 | Goesele et al. | 257/16 |
| 5,318,676 | 6/1994 | Sailor et al. | 204/129.3 |
| 5,358,600 | 10/1994 | Canham et al. | 156/644 |

OTHER PUBLICATIONS

L. T. Cahnam, "Silicon Quantum Wire Array Fabricated by Electrochemical and Chemical Dissolution of Wafers", Appl. Phys. Lett., vol. 57, No. 10, Sep. 3, 1990.
V. Lehman et al, "Porous Silicon Formation: A Quantum Wire Effect", Appl. Phys. Lett., vol. 58, No. 8, Feb. 25, 1991.
D. Manos et al, "Plasma Etching An Introduction", (Chapter 6), Academic Press, Inc. 1989.
S. M. Hu et al, "Observation of Etching of n-Type Silicon in Aqueous HF Solutions", J. Electrochemical Society, vol. 114, p. 414, Apr. 1967.

*Primary Examiner*—Thi Dang
*Attorney, Agent, or Firm*—Michael Zelenka; William H. Anderson

[57] ABSTRACT

Porous silicon is formed by patterning a single crystal silicon substrate prior to electrochemically etching the same. The process is a controlled method of fabricating silicon microstructures which exhibit luminescence and are useful in optoelectronic devices, such as light emitting diodes. The porous silicon produced has a high degree of uniformity and repeatability.

8 Claims, 1 Drawing Sheet

METHOD OF FORMING POROUS SILICON

GOVERNMENT INTEREST

The invention described herein may be manufactured, used, and licensed by or for the Government of the United States of America without the payment to us of any royalty thereon.

BACKGROUND OF THE INVENTION

1. Field of the Invention

The present invention relates to the manufacture of silicon microstructures and, more particularly, the fabrication of porous silicon having radiative properties and useful in optoelectronic devices.

2. Description of the Related Art

Porous silicon can emit light. The use of porous silicon in light emitting diodes is presently being investigated. This light emitting characteristic has been demonstrated in etched porous silicon. The etching has conventionally been done by electrochemical etching. However, the conventional electrochemical etch is highly non-uniform and non-repeatable.

Electrochemical and chemical dissolution steps have been used to fabricate free-standing quantum wires out of bulk silicon wafers. Porous silicon layers having a pore width of 20–500 Å were reported to exhibit red photoluminescence at room temperature. Silicon wafers were anodized at low current densities in hydrofluoric acid-based solutions in order to generate an array of extremely small holes that run orthogonal to the surface of the substrate. See, "Silicon Quantum Wire Array Fabricated by Electrochemical and Chemical Dissolution of Wafers", *Appl. Phys. Lett.*, Vol. 57, No. 10, Sep. 3, 1990. See also, V. Lehmann et al., "Porous Silicon Formation: A Quantum Wire Effect", *Appl. Phys. Lett.*, Vol. 58, No. 8, Feb. 25, 1991.

SUMMARY OF THE INVENTION

It is an object of the present invention to provide a process for manufacturing porous silicon having a high degree of uniformity.

Another object of the invention is to fabricate uniformly porous silicon using technology which is compatible with existing silicon techniques in order to form porous silicon having radiative properties.

These objectives, and other objectives, are achieved by the method of the invention for preparing silicon microstructures, in particular, porous silicon microstructures which exhibit bright luminescence and which are suitable for use in optoelectronic devices. In accordance with the invention, a single crystal silicon substrate is first patterned to form numerous columns of single crystal silicon on the substrate. The patterned substrate is then electrochemically etched to form pores in the silicon columns and convert the same into uniformly porous silicon. The etching decreases the width of each column while simultaneously increasing the height of each column and also the distance between each adjoining column.

Preferably, the substrate is patterned using an electron beam technique such that each column has a width of approximately 1000 Å and a height greater than 10,000 Å. The etching step preferably decreases the width of each column to about 20–30 Å and preferably includes the step of anodizing the patterned substrate in an electrolyte such as a hydrofluoric acid solution, for 10 minutes at 25° C., the solution containing 50% by volume of hydrofluoric acid in ethanol or equivalent alcohol at 10–20 mA per square centimeter.

Other features and advantageous of the present invention will become apparent from the following description of the invention which refers to the accompanying drawing.

DETAILED DESCRIPTION OF THE PREFERRED EMBODIMENTS

In accordance with the invention, a single crystal silicon substrate is patterned to form numerous columns of single crystal silicon on the substrate. The substrate may be any suitable single crystal silicon wafer and preferably is doped n or p-, as is conventionally known. The single crystal silicon may have any suitable crystallinity, but is preferably (001).

The doped, single crystal silicon substrate is patterned using any suitable patterning technique. The patterning technique utilized must achieve dimensions on the order of 1000 Å. Preferably, the silicon substrate is patterned using an electron beam technique because such a technique can achieve dimensions on the order of 0.1 $\mu$m. Another suitable patterning technique is optical lithography. These techniques are known silicon substrate patterning techniques. Electron beam techniques suitable for patterning a material in order to form microstructures in accordance with the invention or similar techniques are discussed in U.S. Pat. Nos. 5,147,823, 5,106,764, 4,348,804, 4,109,029, and 3,619,608, the disclosures of which are all herein incorporated by reference. See also, Plasma Etching An Introduction, edited by D. Manos and D. Flamm, Academic Press, Inc. 1989, in particular Chapter 6 relating to ion beam etching, the disclosure of which including the whole book is herein incorporated by reference. Other techniques will be apparent to one skilled in the art, because those skilled in the art will realize that any electron beam technique will prove effective so long as it can generate the requisite features.

Figure 1:
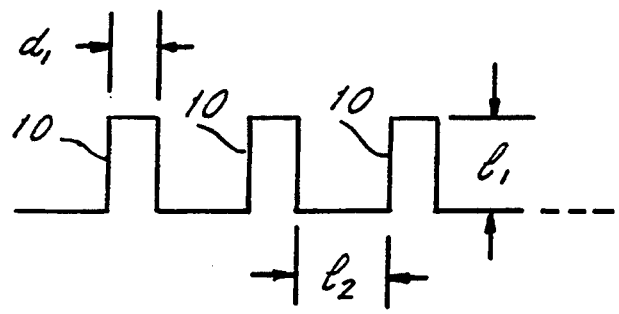
FIG. 1 is a side view of a patterned silicon wafer substrate in accordance with the invention prior to an electrochemical etch and showing certain dimensional relationships of the columns formed by patterning the substrate.
Figure 2:
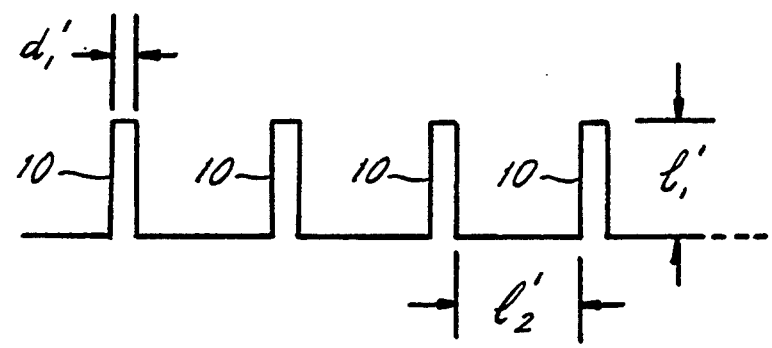
FIG. 2 shows the patterned substrate after the electrochemical etch.
Figure 3:
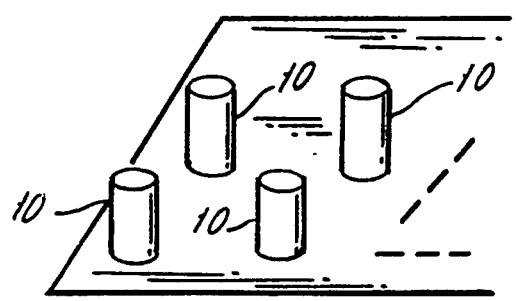
FIG. 3 is a perspective view of a portion of a two-dimensional array of columns of porous silicon prepared in accordance with the invention.

Referring now to FIGS. 1–3, in FIG. 1 a patterned substrate achieved by the above-described preferred electron beam technique is shown. Each column 10 has a width $d_1$ which is preferably about 1000 Å. The height of each column $l_1$ is preferably greater than 10,000 Å, and most preferably is about 1000 Å. The distance between each column $l_2$ is preferably about 20,000 Å. However, from this disclosure, those skilled in the art will recognize that this technique is independent of specific column heights and separations.

Subsequent to the patterning step discussed above, the single crystal silicon wafer substrate having the columns formed thereon is electrochemically etched in order to convert the silicon columns into porous silicon microstructures. The silicon may be etched using any suitable electrochemical etching technique. The silicon wafers are preferably anodized at low current densities in hydrofluoric acid-based solutions in order to generate an array of extremely small holes in the silicon. Electrochemical etching techniques which are suitable for use in the invention are discussed in the articles mentioned above by Canham and Lehmann et al. in Applied Physics Letters, the disclosures of which are herein incorporated by reference. See also, "Observation of Etching of n-Type Silicon in Aqueous HF Solutions," by S. M. Hu et al., J. Electrochemical Society, Vol. 114, Page 414, April 1967, the disclosure of which is herein incorporated by reference. Other electrochemical etching techniques will be apparent to one skilled in the art.

A specific example of an electrochemical etching technique would be to connect the patterned silicon wafer to an anode and subsequently place in an electrolytic etch consisting of 50% hydrofluoric acid and 50% ethanol or equivalent alcohol, such as propanol. A current density of 10–20 milliamperes per square centimeter is then applied across the solution and silicon. If these conditions exist for 10 minutes the sample will be etched sufficiently to have an array of porous silicon columns being approximately 50 Å–100 Å in diameter and to luminesce when excited by a UV light source.

Referring to FIG. 2, an etched porous silicon substrate achieved by the above-described preferred electrochemical etch is shown. Each column 10 now has a width $d_{1'}$ of about 20 Å to about 30 Å. The height $l_{1'}$ of each column 10 has been increased to about 20,000 Å and the distance $l_{2'}$ between each column 10 has increased to about 22,000 Å.

Referring to FIG. 3, the product of the electrochemical etch is an array of porous silicon columns 10 being 50 Å–100 Å in diameter.

Various changes and modifications can be made in the present invention without departing from the spirit and scope thereof. The various embodiments which have been described herein were for the purpose of illustrating the invention but were not intended to limit it.

What is claimed is:

1. A method for preparing a porous silicon microstructure which exhibits bright luminescence for use in optoelectronic devices, comprising the steps of:

patterning a single crystal silicon substrate to form a plurality of single crystal silicon columns thereon; and electrochemically etching the patterned silicon substrate to form pores in the single crystal silicon columns and convert the columns into uniformly porous silicon, the etching step including the steps of decreasing the width of each column while also increasing the height of each column and the distance between each column.

2. The method of claim 1, wherein the patterning comprises forming the columns using an electron beam, each column having a width of approximately 1000 Å and a height greater than 10,000 Å after the electron beam patterning step.

3. The method of claim 1, wherein the etching step comprises the step of decreasing the width of each column to about 20–30 Å.

4. The method of claim 1, wherein the electrochemical etching step comprises the step of anodizing the patterned single crystal substrate in an electrolyte.

5. The method of claim 4, wherein the anodizing step comprises exposing the patterned single crystal substrate to a hydrofluoric acid solution for 10 minutes at 25° C., the solution containing 50% by volume hydrofluoric acid.

6. The method of claim 1, wherein the etching step comprises electrochemically etching the patterned silicon substrate until the columns are between 50 Å–100 Å in diameter.

7. In a method of preparing a porous silicon microstructure which exhibits luminescence and which is useful in an optoelectronic device by electrochemically etching a silicon substrate to form pores in the silicon and convert the silicon into uniformly porous silicon, the improvement comprising the step of patterning the silicon substrate prior to the etching step to form a plurality of columns of single crystal silicon on the substrate.

8. The method of claim 7, wherein the patterning comprises forming the columns using an electron beam, each column having a width of approximately 1000 Å and a height greater than 10,000 Å after the electron beam patterning step.

* * * * *